United States Patent [19]
Price

[11] Patent Number: 5,894,431
[45] Date of Patent: Apr. 13, 1999

[54] LOW POWER OUTPUT BLOCK FOR LARGE ROM

[75] Inventor: Carl W. Price, Corvallis, Oreg.

[73] Assignee: Hewlett-Packard Company, Palo Alto, Calif.

[21] Appl. No.: 09/063,423

[22] Filed: Apr. 20, 1998

[51] Int. Cl.$^6$ .................................................. G11C 17/00
[52] U.S. Cl. ...................... 365/103; 365/189.05; 365/191
[58] Field of Search .............................. 365/103, 189.05, 365/191

[56] References Cited

U.S. PATENT DOCUMENTS

| | | | |
|---|---|---|---|
| 4,404,654 | 9/1983 | Kamuro et al. | 365/103 |
| 5,373,480 | 12/1994 | Kudou | 365/230.08 |
| 5,428,574 | 6/1995 | Kuo et al. | 365/201 |

*Primary Examiner*—David Nelms
*Assistant Examiner*—VanThu Nguyen

[57] ABSTRACT

In a ROM having a ROM core and a plurality of output enable circuit blocks, precharging is achieved by precharging one or more nodes in each output enable circuit block. Each of the nodes corresponds to a group of bit lines. Substantially less current is used to precharge the nodes than is used to precharge multiple bit lines. The output enable circuit block includes a plurality of column enable circuits and a least one buffer. Each column enable circuit receives an enable signal and a bit line signal, and has an output line coupled to one of the buffers. During precharging, the output lines are in tri-state and the precharge signal drives the buffers. After precharging, one enable signal goes active. The corresponding column enable circuit generates an output which drives a buffer. The other column enable circuits are in tri-state.

12 Claims, 5 Drawing Sheets

5,894,431

LOW POWER OUTPUT BLOCK FOR LARGE ROM

BACKGROUND OF THE INVENTION

This invention relates generally to read only memory circuits, and more particularly, to precharge and output enable methods for reducing power consumption of read only memory circuits.

There is a continuing need for increased memory capacity and reduced power consumption of read only memory (ROM) and other memory storage devices. ROM circuits are included on dedicated ROM integrated circuits and as circuit blocks on other integrated circuits such as ASICs. FIG. 1 shows a timing diagram for a conventional ROM circuit having a clock signal 'CLK', an address signal 'Address' and a data signal 'Data.' According to standard ROM operation, the ROM circuitry is precharged during each access cycle to assure that a valid data value is read from a ROM cell. Without precharging, the data corresponding to a desired address may be corrupted.

Conventionally, the entire ROM core is precharged during each access cycle. During one phase of the access cycle precharging occurs. During a subsequent phase, data is read. In a typical embodiment the step of precharging includes charging a capacitance on each bit line of the ROM core. Discharging then occurs during a subsequent read phase of the access cycle. Referring to the timing diagram of FIG. 1, a ROM is in a precharge mode when signal nCS is unasserted (e.g., logic 1). During such mode the address decoders and output drivers are disabled, and the signal 'precharge' is active (e.g., logic 1). The precharge signal is given a long rise time to charge up the column slowly so that it does not introduce electromagnetic interference in a ROM cell. Signal 'rowdecsel' is the enable signal for the row and column decoders and is the logical inverse of signal nCS.

When nCS is asserted (e.g., logic 0), the precharge mode is over and discharging/reading begins. Signal rowdecsel becomes active (e.g., logic 1) to enable row and column decoding. The address bus latches. Soon after signal nCS is asserted, signal nRD also is asserted (e.g., logic 0) to enable the output drivers. Signal 'out enable' is the output buffer enable signal and is the logical NOR of signals nCS and nRD. After signal 'out enable' becomes active (e.g., logic 0) the data signal becomes valid (e.g., portion 12 of signal Data.

In an exemplary ROM circuit each bit line has a capacitance of approximately 2 picofarads which is precharged and discharged. For a 1024 column design, approximately 2048 pf are charged during each access cycle. Accordingly, considerable power is consumed by large ROMs having many columns. It is desirable to implement more efficient ROM circuits which consume relatively less power without compromising operability or performance.

SUMMARY OF THE INVENTION

ROM circuits include a plurality of ROM cells organized in rows and columns with data content selected and output using word lines and bit lines. The word lines typically correspond to rows and the bit lines correspond to columns. The ROM cells, word lines and bit lines form the ROM core. A plurality of output enable circuit blocks typically form another part of the ROM, where the bit lines are multiplexed down to a number of data output lines (e.g., for an 8 bit word, 8 output lines). Conventionally, the ROM is precharged by precharging each bit line of the ROM core. According to the invention, rather than precharging the bit lines of the ROM core, only a corresponding output node within each output enable circuit block is precharged. Such output node corresponds to a group of columns (and thus bit lines). One advantage of the invention is that substantially less current is used to precharge the output node than is used to precharge multiple bit lines. In a specific embodiment the power consumed during precharging is on the order of 100 times less when precharging the output node.

According to one aspect of the invention, an output enable circuit block is coupled to a plurality of bit lines, and thus serves a group of columns of the ROM core. Such block includes a chain of column enable circuits and an output buffer. An enable signal and a bit line are coupled to each column enable circuit. The respective outputs of the column enable circuits for a given block, along with the precharge signal are commonly coupled to the output node.

According to another aspect of this invention, the output node occurs at an output buffer circuit or an invertor output buffer circuit. The output buffer is scaled to detect and respond to a voltage swing at its input. The voltage swing is typically less than the ideal 0 V to Vdd voltage swing. This is because transistors from the column enable circuit are in the current path from Vdd to ground. The variation from the ideal voltage swing depends on the sizes of transistors.

According to another aspect of the invention, each column enable circuit includes an nmos transistor and a pmos transistor configured as a voltage divider. Such transistors are scaled so that the voltage swing on the output node swings to a maximum range, while keeping the current desirably low and the switching speed desirably fast. In an exemplary embodiment a voltage swing of 0.9 V to Vdd is achieved.

According to another aspect of the invention, the enable signals are inactive during a precharge phase of an access cycle. The precharge signal precharges the output node (i.e., the input line of the output buffer) during the precharge phase. During a subsequent phase of the access cycle, an enable signal goes active driving the output node to an appropriate logic level.

According to another aspect of the invention, the number of output enable circuit blocks, n, is equal to the number of bit per word for the ROM. In addition, each output enable circuit block receives the same 'm' enable signals. During the read phase of the access cycle one of these enable signals goes active. Thus, one bit line per output enable circuit block is read. These bit lines correspond to the n bits of a word being addressed and read.

According to another aspect of this invention, the timing diagram for an embodiment of this invention is generally the same as the conventional ROM timing diagram, thereby minimizing the impact on designers implementing the ROM circuit. Due to a lower capacitance to be precharged, however, the time to precharge is less for this invention. Thus, in some embodiments a ROM may be operated at faster speeds without changing the circuitry.

An advantage of this invention is reduced power consumption due to precharging a small output node capacitance rather than the larger capacitances of multiple bit lines. Such a precharging scheme is particularly beneficial for increasingly large ROM designs. Another advantage is that conventional combinational logic gates may be used to multiplex bit lines within each output enable circuit block. These and other aspects and advantages of the invention will be better understood by reference to the following detailed description taken in conjunction with the accompanying drawings.

DESCRIPTION OF SPECIFIC EMBODIMENTS

Overview

Figure 2:
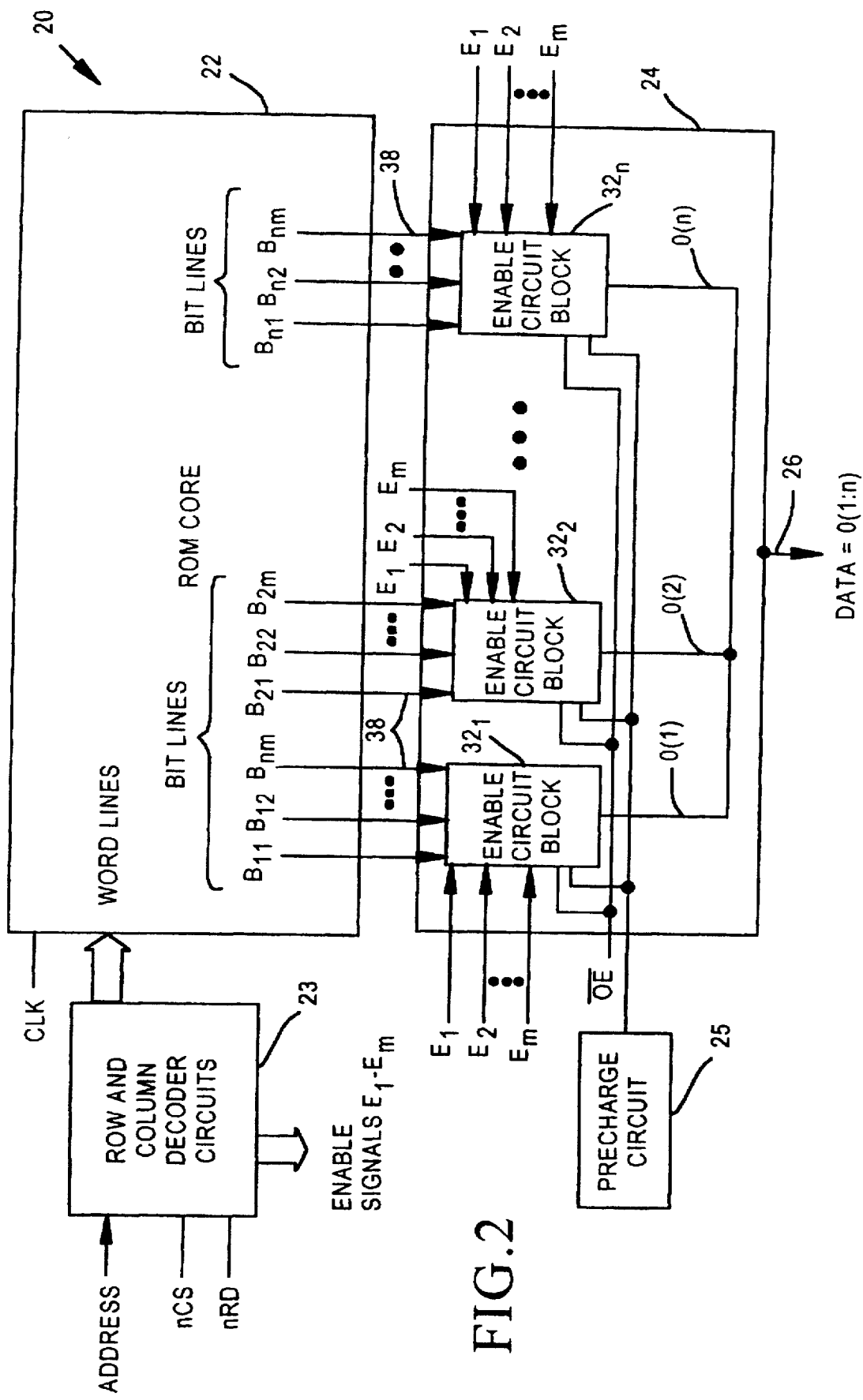
FIG. 2 is a block diagram of a read only memory circuit according to an embodiment of this invention.

FIG. 2 shows blocks of a read only memory (ROM) circuit 20, including a ROM core circuit block 22, decoder circuits 23, a precharge circuit 25, and an output control and multiplexing block 24. The ROM circuit 20 is formed as an integrated circuit on a semiconductor chip alone or with other circuitry (e.g., an ASIC device). The read only memory circuit 20 is for storing read only data within addressable memory cells. The circuit 20 receives an address signal along with a clock signal, a chip select signal nCS, and a read signal nRD, where 'n' corresponds to the number of bits in a word. During a read cycle, data stored in memory cells corresponding to a received address signal is output as a data signal 26.

Figure 3:
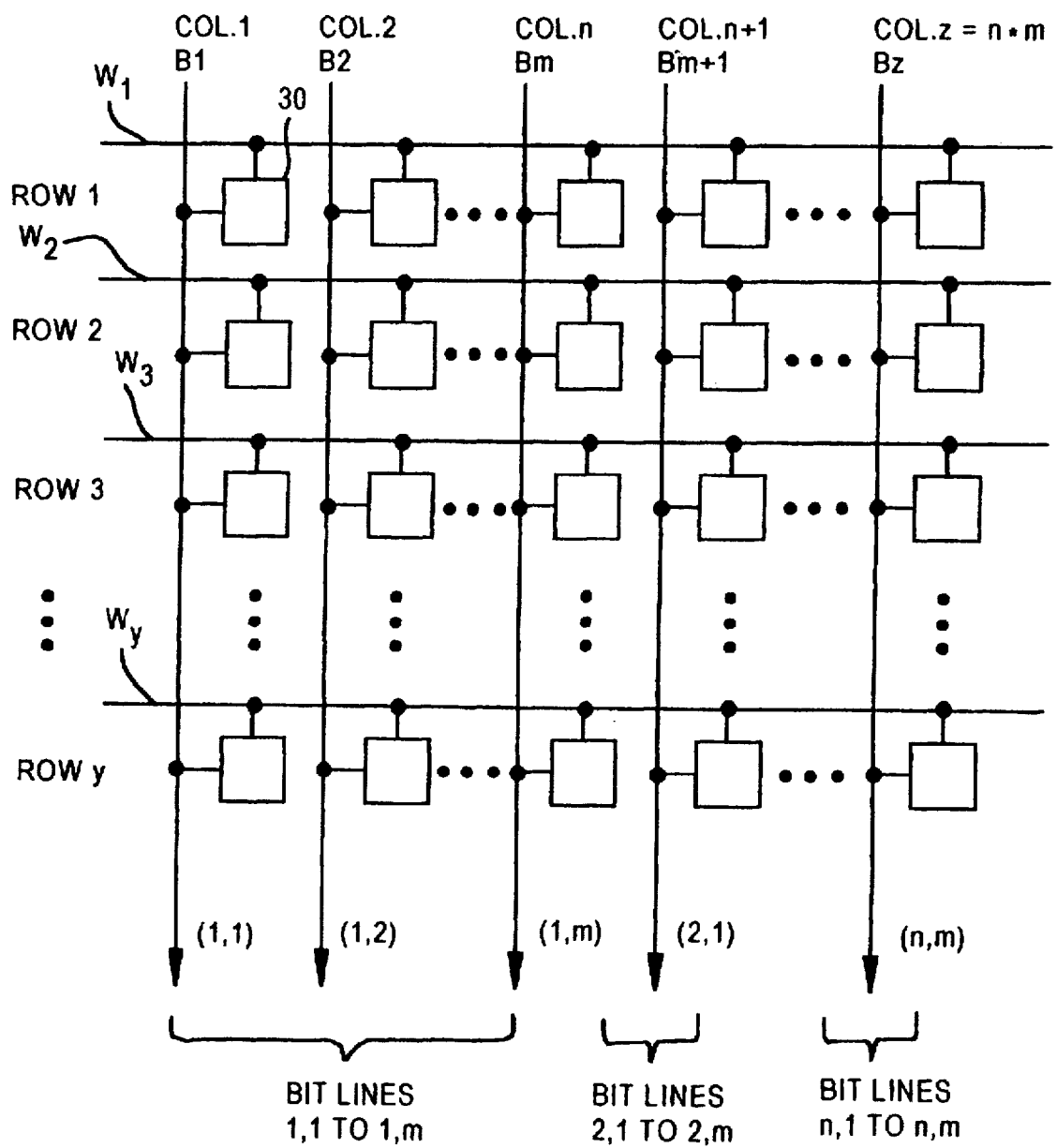
FIG. 3 is a diagram of the core circuitry of the read only memory circuit of FIG. 2.

The ROM core circuit 22, as shown in more detail in FIG. 3, includes memory cells 30 organized into a plurality of rows (e.g., numbered 1 to y) and a plurality of columns (e.g., numbered 1 to z). For each row there is a word line W which selects the cells in such row. Typically, one word line is active at a time to select reading from one row of cells. For each column there is a bit line B which selects the cells in such column. In a conventional ROM all bit lines are selected at one time. The desired bits forming the word then are selected using multiplexing circuitry. According to an aspect of this invention, less than all bits are sleected at a time. According to a preferred embodiment 'n' bits are selected (i.e., active) at a given time to select reading from n columns of cells. The n bit lines are for accessing the n bits of a given word. Thus, the columns are organized in groups of 8. For example in a core having 1024 columns, there are 1024/8=128 words stored per row. The n cells selected with the active word line and n active bit lines form the word to be read.

Referring again to FIG. 2, the bit lines B are coupled to 'n' enable circuits 32 of the output control and multiplexing circuit block 24. In a preferred embodiment there are 'n' output enable circuit blocks ('enable circuits') $32_1$ to $32_n$, where n is the number of bits in a word, and is less than the 'z' number of bit lines B1 to Bz. In a specific embodiment there are m bit lines coupled to each enable circuit 32. In a preferred embodiment m=z/n, although in other embodiments the value for 'm' may differ. Bit lines $B_{11}$ through $B_{1m}$ are connected to enable circuit $32_1$. Bit lines $B_{21}$ through $B_{2m}$ are coupled to enable circuit $32_2$. Bit lines $B_{n1}$ through $B_{nm}$ are connected to enable circuit $32_n$. The enable circuits 32 include data input lines 38 which connect to the bit lines B. Data read from a cell of a selected column is received at an enable circuit 32 by traversing the corresponding bit line B and input data line 38.

Each enable circuit 32 also receives a plurality of enable signals E and an output enable signal OE inverted. In a preferred embodiment there is one enable signal E for each bit line B coupled to a given enable circuit 32. Thus each enable circuit 32 receives 'm' enable signals $E_1$ through $E_m$. In operation not more than one of the m enable signals is active at a given time. For each enable circuit $32_1$ to $32_n$, the data on the bit line corresponding to the active enable line is output during a read cycle. Thus, there are n output signal lines O(1) to O(n) which form the n bits of a data output signal 26.

Figure 4:
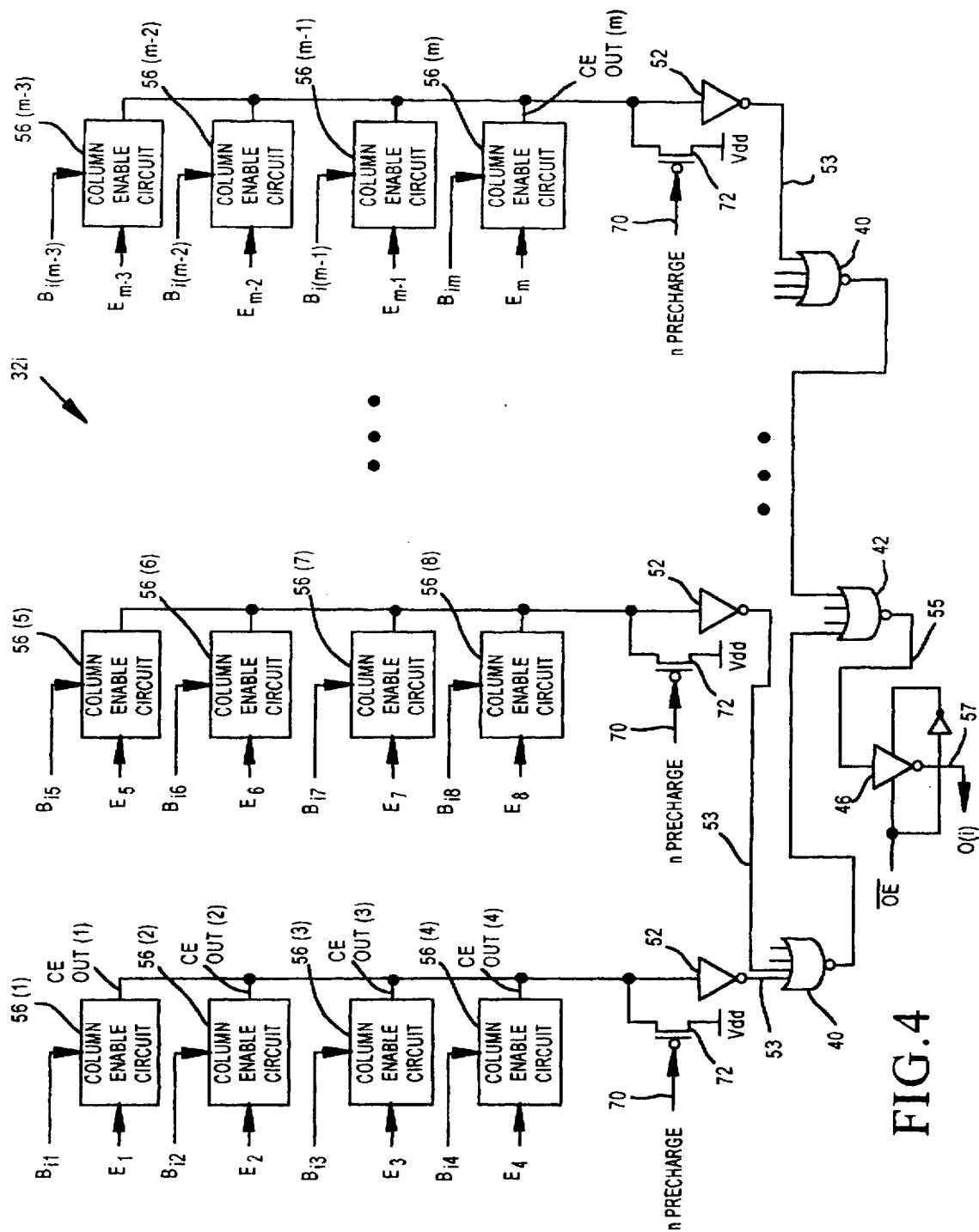
FIG. 4 is a schematic diagram of an output enable circuit block of FIG. 2 according to an embodiment of this invention.

FIG. 4 shows a given enable circuit $32_i$, which includes 'm' column enable circuits 56(1)-56(m), along with pull-up transistors 72, output buffers 52, combinational logic gates 40, 42 and a tri-state buffer 46.

Figure 5:
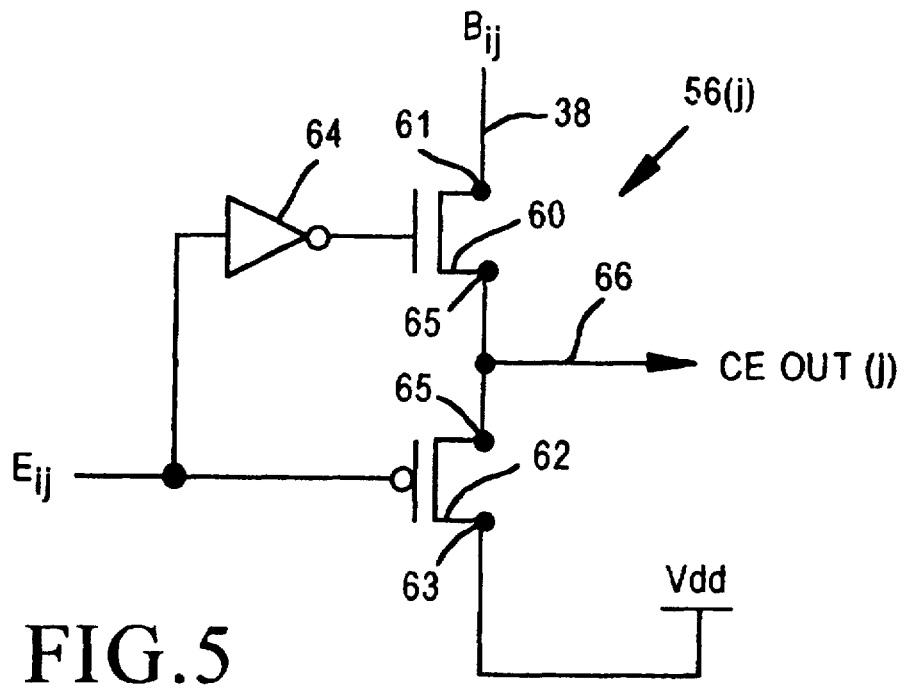
FIG. 5 is a circuit schematic of a column enable circuit of FIG. 4 according to one embodiment of this invention.
Figure 6:
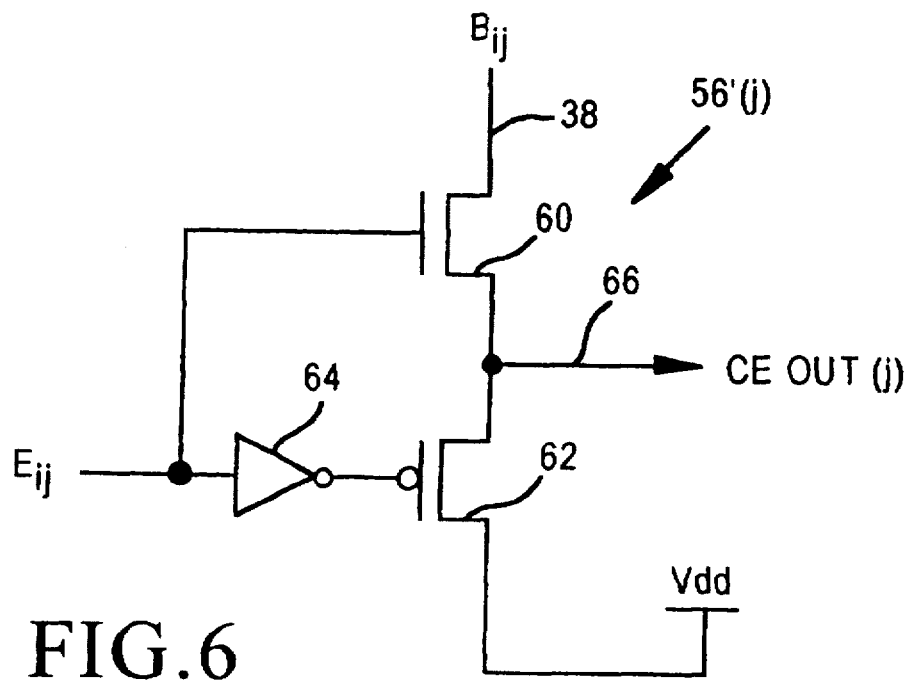
FIG. 6 is a circuit schematic of a column enable circuit of FIG. 4 for an alternative embodiment of this invention.

FIG. 5 shows an exemplary one of the column enable circuits 56(j), including an nmos transistor 60, a pmos transistor 62 and an invertor 64. The transistors 60, 62 are configured as a voltage divider. Each column enable circuit 56(j) receives a corresponding enable signal $E_{ij}$ and is coupled to a corresponding bit line $B_{ij}$. The bit line is coupled to one node 61 (e.g., one of either the source or drain) of the nmos transistor 60, while voltage $V_{dd}$ is coupled to one node 63 (e.g., one of either the source or drain) of the pmos transistor 62. The other node 65 (e.g., the other of either the source or drain) of the respective transistors 60, 62 is tied to an output line 66 where the output CE OUT(j) of the column enable circuit 56j is presented. The enable signal $E_{ij}$ is fed into the gate of each of the transistors 60, 62, although the signal is inverted by invertor 64 on route to the pmos transistor 60. FIG. 6 shows an alternative embodiment of a column enable circuit 56'(j) in which the invertor 64 is coupled to the gate of transistor 62 instead of transistor 60. For such alternative embodiment the enable signals E are active high instead of active low.

Referring again to FIG. 4, the column enable circuits 56 are grouped, in which each column enable circuit of a given group has its out signal CE OUT commonly coupled to an input node of a corresponding inverting buffer 52. There is one inverting buffer 52 for each group of column enable circuits. Although, FIG. 4 shows 4 column enable circuits per group the number of circuits 56 per group may differ. Although it is preferable that each group have the same number of column enable circuits (e.g., 4 per group; 16 per group), in other embodiments respective groups may include differing numbers of column enable circuits 56 (e.g., 3 in one group; 4 in another group; 5 in another group).

The precharge signal 70 also is coupled to the input node of each inverting buffer 52. A pull-up pmos transistor 72 applies the precharge signal 70 to the input node when the precharge signal is active. The output lines 53 of each inverting buffer 52 are coupled to combinational logic gates 40 and 42, during the read phase of an access cycle, the output line 55 of such combinational logic has the logic level of the one bit line which is enabled. Such logic level is presented at the tri-state buffer 46. During the read phase, the output enable signal OE inverted enables the buffer 46 to output such logic level as the output signal portion O(i) for such enable circuit 32i. During the precharge phase of the access cycle, the tri-state buffer 46 output line 57 is in a high impedance state.

Column Enable Circuit 56 Operation

For a given column enable circuit 56(j), as shown in FIG. 5, both the nmos transistor 60 and the pmos transistor 62 are on while the enable signal Eij is active (e.g., low). If the selected ROM cell 30 is programmed, then bit line $B_{ij}$ is at ground. This allows a current path from $V_{dd}$ through the transistors 60, 62 to ground. As a result, the output line 66 is unable to be pulled all the way to ground. According to an aspect of the invention, the transistors 60, 62 are scaled so that the output line 66 can be pulled near to ground within a reasonable time. For a specific embodiment one skilled in the art will appreciate that design tools such as OPTSPICE can be used to scale the transistors so as to achieve the best signal voltage level within desired timing constraints. It is preferred that the voltage on the output line 66 have the greatest swing while keeping the current low and the speed fast. The level of the voltage above ground depends on the size of the transistors 60, 62.

If the enable signal $E_{ij}$ is active and the selected ROM cell 30 is not programmed, then there is a capacitance along the bit line $B_{ij}$ and the output line 66 that can be charged. As a result a voltage $V_{dd}$ occurs at the output line 66. The amount of capacitance to be charged is determined by the number of bit lines m in the enable circuit $32_i$, including the column enable circuit 56(j) and the size of the ROM core circuitry 22 (i.e., how many rows occur along a bit line and what fabrication process is being used). Such values effect the rise time for the output line to reach $V_{dd}$. The value for m, (e.g., the number of bit lines B and the number of enable lines E per enable circuit 32), is prescribed based upon the capacitance and speed needed on the input node to the corresponding inverting buffer 52.

In a final case, the enable signal $E_{ij}$ is inactive (e.g., high) causing both transistors 60, 62 to be off. The output line 66 then is in a tri-state condition allowing the output of one of the other column enable circuits 56 (or the precharge signal 70) to drive the input node of the corresponding inverting buffer 52.

The scaling that is implemented to achieve a desired voltage swing within required timing constraints impacts the scaling of the inverting buffer 52. The inverting buffer 52 is scaled to be able to detect and respond to the voltage swing at its input node. This swing will not be a full voltage swing from 0 V to $V_{dd}$. The scaling instead depends on the various voltage dividers formed in each corresponding column enable circuit 56.

The scaling of the invertor 64 of each column enable circuit 56(j) does not impact the voltage swing and can be kept as close to minimum as desired. Although the invertor 64 is connected to the nmos transistor 60, it instead may be connected to the pmos transistor 62 to allow for an active high enable signal (e.g., as in the FIG. 6 embodiment), rather than an active low enable signal (e.g., as in the FIG. 5 embodiment).

ROM Method of Operation

Figure 1:
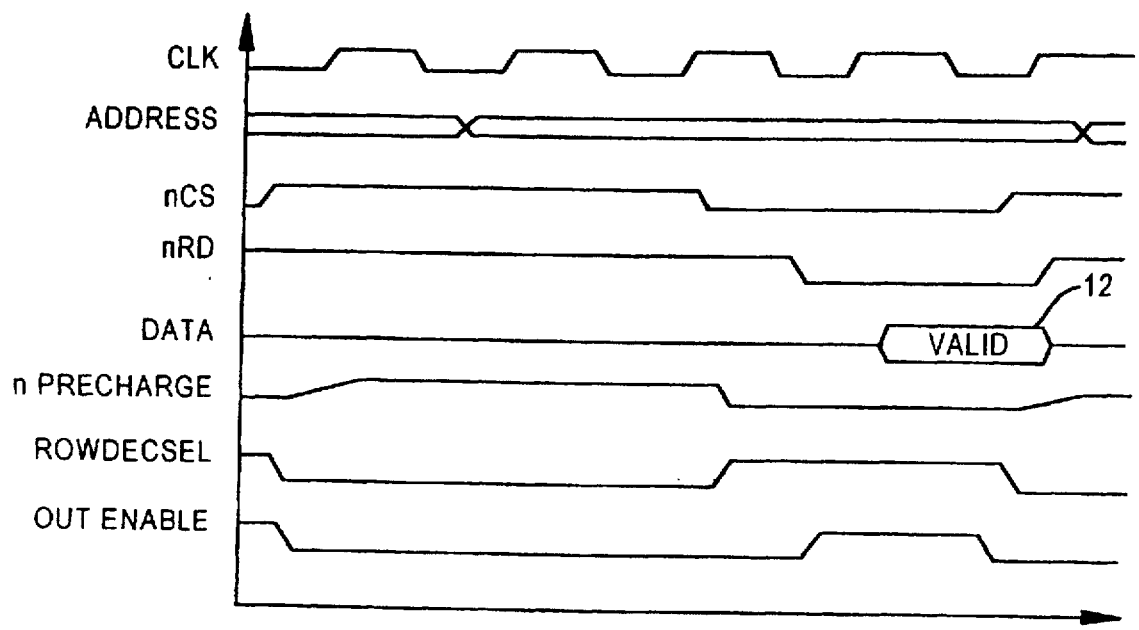
FIG. 1 is a timing diagram for a read only memory circuit.

FIG. 1 shows a timing diagram for precharging and accessing the ROM circuit 20. Note that the timing is the same as in a conventional ROM circuit. This allows the ROM circuit 22 to be implemented without adversely impacting circuit designs. In a preferred embodiment the rise time on the precharge signal is faster than the rise time shown in FIG. 1 for the conventional ROM timing diagram. In an alternative embodiment the precharge signal (e.g., n Precharge) is an inversion of the nCS signal.

Like in a conventional ROM, the ROM circuitry 22 is precharged during each access cycle to assure that a valid data value is read from a ROM cell. However, rather than charge each and every bit line of the ROM core during each access cycle, only the input nodes of the respective inverting buffers 52 in each enable circuit block 32 are precharged. More significantly, the bit lines themselves need not be precharged. The amount of capacitance to precharge the input nodes of a plurality of inverting buffers 52 is substantially less than the cumulative capacitance of the n bit lines which the inverting buffer serves. As a result the precharging phase of the access cycle consumes substantially less power for the ROM circuit 20 of this embodiment than in a conventional ROM circuit. This result is particularly beneficial for large ROM circuits where the power consumption in the current path (for a programmed bit) is more than compensated for by the power savings from not precharging the bit lines themselves.

An access cycle includes a precharge phase for precharging the input node of the output buffer 52 and a read or data output phase where data is presented at the ROM circuit output line 26. Referring to the timing diagram of FIG. 1, the ROM circuit 20 is in a precharge mode when signal nCS is unasserted (e.g., logic 1). During such mode the address decoders and tri-state buffers 46 are disabled, and the precharge signal 70 (see FIG. 5) is active (e.g., logic 1). The precharge signal need not have the long rise time of the conventional ROM, however, because there is not the danger of introducing electromagnetic interference into the ROM cells. Signal 'rowdecsel' is the enable signal for the row and column decoders and is the logical inverse of signal nCS. The enable signals E are derived from the rowdecsel signal. During the precharge phase all the enable signals E are inactive. Thus, the output lines 66 of the column enable circuits 56 are all in a tri-state condition. The precharge signal therefore drives the input node of the inverting buffers 52 so as to precharge such nodes. Such nodes are discharged, at least in part, during the subsequent read phase of the access cycle.

When nCS is asserted (e.g., logic 0), the precharge mode is over and the read phase begins. Signal rowdecsel becomes active (e.g., logic 1) to enable row and column decoding. The address bus latches. Based upon the decoding one of the enable signals E becomes active for a given access cycle. The output line 66 for the column enable circuit 56 corresponding to such line switches from a tri-state condition to one of the voltage levels, low or high (e.g., 0.9 V or $V_{dd}$), depending on whether the ROM cell has been programmed (i.e., logic 1) or left unprogrammed (i.e., logic 0). The output lines 66 for each of the other column enable circuits 56 having an inactive enable signal E are still in tri-state. In addition, the precharge signal 70 is inactive with pmos transistor 72 having a tri-state output line 75. Thus, the voltage level at the output line 66 of the enabled column enable circuit 56 drives the input node of the corresponding inverting buffer 52. Such voltage level passes through the combinational logic circuits 40, 42 to the tri-state buffer 46. Soon after signal nCS is asserted, signal nRD also is asserted (e.g., logic 0) to enable the tri-state buffer 46. Signal OE inverted is the tri-state buffer 46 enable signal and is the logical NOR of signals nCS and nRD. After signal OE inverted becomes active (e.g., logic 0) the data signal portion 0(i) becomes valid.

In an exemplary ROM circuit each bit line has a capacitance of approximately 2 picofarads which is precharged and discharged. For a 1024 column design, approximately 2048 pf are charged during each access cycle. For a ROM of the same capacity formed as an embodiment of this invention with, for example, a voltage swing of 0.9 V to $V_{dd}$, the precharging phase consumes approximately 100 times less power for this invention than for the conventional ROM.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. An output block of circuitry for a read only memory having a plurality of ROM cells organized into a plurality of rows and a plurality of columns of ROM cells, each column having a corresponding bit line, the output block comprising:

a plurality of column enable circuits, each one column enable circuit of the plurality of column enable circuits coupled to a corresponding bit line, said each one column enable circuit receiving a corresponding data signal from said corresponding bit line and a corresponding enable signal, said each one column enable circuit in response generating a corresponding output signal; and an output circuit receiving in common a precharge signal and the corresponding output signal from each one of the plurality of column enable circuits, wherein said output circuit is precharged during a precharge phase of an access cycle, and wherein said output circuit generates an output circuit output signal during a subsequent phase of the access cycle, wherein during the precharge phase the corresponding enable signal of said each one of the plurality of column enable circuits is inactive and the precharge signal is active, and wherein during the subsequent phase the enable signal corresponding to a select one of the plurality of column enable circuits is active and the precharge signal is inactive.

2. The output block of circuitry of claim 1, in which each one of the plurality of column enable circuits is configured as a voltage divider.

3. A read only memory circuit, comprising:

core circuitry including a plurality of ROM cells organized into rows and columns of ROM cells, the core circuitry having a plurality of word lines and a plurality of bit lines;

a plurality of output enable circuit blocks, each one block of the plurality of output enable circuit blocks coupled to a subset of the plurality of bit lines of the core circuitry, each one block of the plurality of output enable circuit blocks receiving a common plurality of enable signals, said each one block comprising:

(i) a plurality of column enable circuits, each one of the plurality of column enable circuits coupled to a corresponding bit line and receiving a data signal from said corresponding bit line, and said each one of the plurality of column enable circuits further receiving one enable signal of the plurality of enable signals, said each one of the plurality of column enable circuits in response generating a corresponding output signal; and (ii) at least one output buffer receiving in common a precharge signal and each corresponding output signal of said each one of the plurality of column enable circuits, wherein said at least one output buffer is precharged during a precharge phase of an access cycle, and wherein said at least one output buffer generates an output during a subsequent phase of the access cycle, wherein during the precharge phase said plurality of enable signals are inactive and the precharge signal is active.

4. The read only memory of claim 3, wherein during the subsequent phase one of said plurality of enable signals is active and the precharge signal is inactive for each one of the plurality of output enable circuit blocks.

5. The read only memory of claim 3, further comprising:

means for selecting the output circuit output signal from one of the plurality of output circuit blocks as a ROM data output corresponding to a ROM address input.

6. The read only memory of claim 5, in which said each one block further comprises a tri-state buffer coupled to the output of said at least one output buffer, and wherein said tri-state buffer has a high impedance state during the precharging phase.

7. The read only memory of claim 3, in which each one of the plurality of column enable circuits is configured as a voltage divider.

8. A method for operating a read only memory circuit having a core circuit portion and a plurality of output enable circuits, the core circuit portion including a plurality of ROM cells organized into rows of ROM cells and columns of ROM cells, the core circuitry having a plurality of word lines and a plurality of bit lines, each one of the plurality of word lines corresponding to a row of ROM cells, each one of the plurality of bit lines corresponding to a column of ROM cells, each one of the plurality of output enable circuits coupled to a subset of the plurality of bit lines, the method comprising the steps of:

during a precharging phase of an access cycle, precharging the read only memory circuit by precharging a plurality of nodes within each one of the plurality of output enable circuits, wherein there are fewer nodes precharged within said each one of the plurality of output enable circuits than there are bit lines coupled to said plurality of output enable circuits; and subsequent to the precharging phase of the access cycle, generating a data output signal at each one of the plurality of output enable circuits, the generated data output signals corresponding to data stored in ROM cells which are read from the core circuit portion.

9. The method of claim 8, further comprising, after the step of precharging, the step of discharging at least in part, each one of said plurality of nodes.

10. The method of claim 8, in which each one of the plurality of nodes receives a first data signal and a precharge signal, and further comprising during the precharging step, the step of disabling the first data signal.

11. The method of claim 10, further comprising subsequent to the precharging phase, the step of enabling the first data signal of at least one of the plurality of nodes.

12. The method of claim 8, in which each one of the plurality of bit lines has a capacitance, and wherein the step of precharging the read only memory circuit is achieved without precharging the plurality of bit lines.

* * * * *